United States Patent
Lin et al.

(10) Patent No.: US 7,464,463 B2
(45) Date of Patent: Dec. 16, 2008

(54) METHOD FOR MAKING A HEAT DISSIPATING DEVICE

(75) Inventors: Jao-Ching Lin, Hsin-Chuang (TW);
Pei-Pei Ding, Hsin-Chuang (TW);
Hsiu-Wei Yang, Hsin-Chuang (TW);
Wen-Hwa Yu, Hsin-Chuang (TW);
Yen-Wen Chen, Hsin-Chuang (TW)

(73) Assignee: Asia Vital Components Co., Ltd. (TW)

( * ) Notice: Subject to any disclaimer, the term of this patent is extended or adjusted under 35 U.S.C. 154(b) by 544 days.

(21) Appl. No.: 11/219,557

(22) Filed: Sep. 2, 2005

(65) Prior Publication Data

US 2006/0213063 A1    Sep. 28, 2006

(30) Foreign Application Priority Data

Mar. 28, 2005    (TW) .............................. 94109616 A

(51) Int. Cl.
*B23P 6/00*    (2006.01)
(52) U.S. Cl. .............................. 29/890.032; 165/104.26
(58) Field of Classification Search ............... 29/890, 29/890.032; 34/92; 73/863; 165/104.26, 165/104.21; 285/382
See application file for complete search history.

(56) References Cited

U.S. PATENT DOCUMENTS

| 5,895,868 | A  | * | 4/1999 | Giammaruti et al. ..... 73/863.81 |
| 6,508,302 | B2 | * | 1/2003 | Ishida et al. ........... 165/104.26 |
| 6,871,701 | B2 | * | 3/2005 | Ueki et al. ............. 165/104.26 |
| 7,229,104 | B2 | * | 6/2007 | Hsu ........................... 285/382 |
| 2005/0022414 | A1 | * | 2/2005 | Hsu ............................... 34/92 |
| 2006/0162161 | A1 | * | 7/2006 | Hsu ...................... 29/890.032 |

\* cited by examiner

*Primary Examiner*—Quang D. Thanh
*Assistant Examiner*—Ryan J Walters
(74) *Attorney, Agent, or Firm*—Ostrolenk, Faber, Gerb & Soffen, LLP

(57) ABSTRACT

A method for making a heat dissipating device includes the steps of: mounting an elastically deformable member on a container body in such a manner that the elastically deformable member covers a periphery of an opening in the container body and that the elastically deformable member cooperates with the container body to define a cavity in fluid communication with an inner space in the container body through the opening; vacuuming the inner space in such a manner that air in the inner space is drawn through the opening and the cavity to the outside of the container body; filling the inner space with a predetermined amount of a working fluid through the opening and the cavity; and forming a sealing mechanism that functions to isolate the inner space from the opening.

2 Claims, 9 Drawing Sheets

METHOD FOR MAKING A HEAT DISSIPATING DEVICE

CROSS-REFERENCE TO RELATED APPLICATION

This application claims priority of Taiwanese application no. 094109616, filed on Mar. 28, 2005.

BACKGROUND OF THE INVENTION

1. Field of the Invention

This invention relates to a method for making a heat dissipating device, more particularly to a method for making a heat dissipating device including a container body with a wick structure and a working fluid therein.

2. Description of the Related Art

FIG. 1 illustrates a conventional heat dissipating device, which is a flat plate-type heat pipe, useful for dissipating heat resulting from operation of an electronic component, such as a CPU, attached thereto. The heat dissipating device includes a container 1 with a container body 11 made from a metal and having heating and cooling ends 111, 112, a wick structure 12 formed in the container body 11, and a working fluid 13 filled in the container body 11. The wick structure 12 is formed with a network of capillaries 121. In use, the working fluid 13 at the heating end 111 is vaporized upon absorbing heat from the electronic component. The vapor thus formed flows from the heating end 111 toward the cooling end 112, and is subsequently condensed thereat, which, in turn, results in a liquid flow from the cooling end 112 toward the heating end 111 by virtue of the capillary mechanism of the capillaries 121 of the wick structure 12, thereby enabling automatic circulation of the working fluid 13 in the container body 11.

Since the liquid-vapor balance of the working fluid 13 in the container body 11 is critical to efficient heat dissipation, it is required that there be substantially no presence of air in the container body 11.

FIGS. 2 to 4 illustrate a conventional method for making the heat dissipating device. The method includes the steps of inserting a tube 14 into an opening 113 in the container body 11, sealing a clearance around the tube 14 by welding techniques, vacuuming the container body 11 through the tube 14, filling the container body 11 with the working fluid 13 through the tube 14, deforming the tube 14 to form a closure 141 so as to provide a temporary sealing for preventing air from entering into the container body 11, and immediately cutting the tube 14 such that the closure 141 remains on the container body 11 and then sealing an outer end 142 of the closure 141 with a sealing material.

Since the temporary sealing effect provided by the closure 141 thus formed is poor, air may enter into the container body 11 through slits formed in the closure 141 prior to the sealing operation of the closure 141, thereby adversely affecting the vapor-liquid balance of the working fluid 13 in the container body 11. As a consequence, the sealing operation is required to be conducted at the same apparatus where the deforming and sealing operations are performed, which considerably increases the cost of the apparatus.

SUMMARY OF THE INVENTION

The object of the present invention is to provide a method for making a heat dissipating device that is capable of overcoming the aforesaid drawbacks of the prior art.

According to the present invention, there is provided a method for making a heat dissipating device. The method comprises the steps of: preparing a container body that defines an inner space therein and that is formed with an opening in fluid communication with the inner space, the container body being provided with a wick structure mounted in the inner space; mounting an elastically deformable member on the container body in such a manner that the elastically deformable member covers a periphery of the opening and that the elastically deformable member cooperates with the container body to define a cavity in fluid communication with the inner space through the opening; vacuuming the inner space in such a manner that air in the inner space is drawn through the opening and the cavity to the outside of the container body and that the elastically deformable member is elastically contracted due to vacuuming of the cavity, thereby forming a sealing effect at a juncture between the elastically deformable member and the periphery of the opening; filling the inner space with a predetermined amount of a working fluid through the opening and the cavity; and forming a sealing mechanism that functions to isolate the inner space from the opening.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
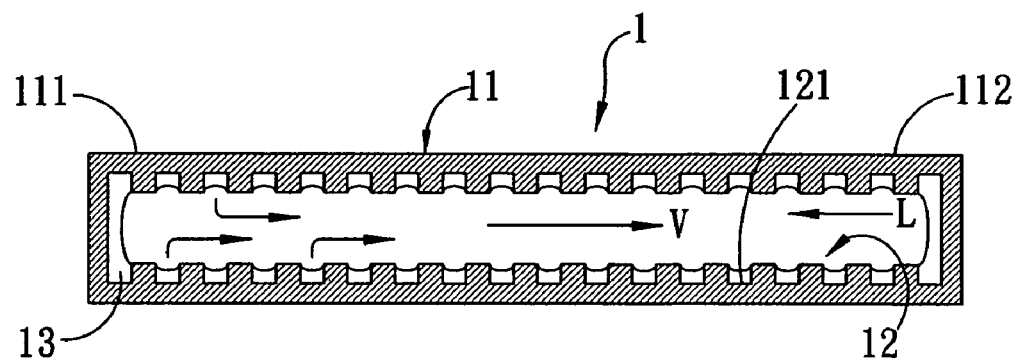
FIG. 1 is a sectional view of a conventional heat dissipating device.
Figure 2:
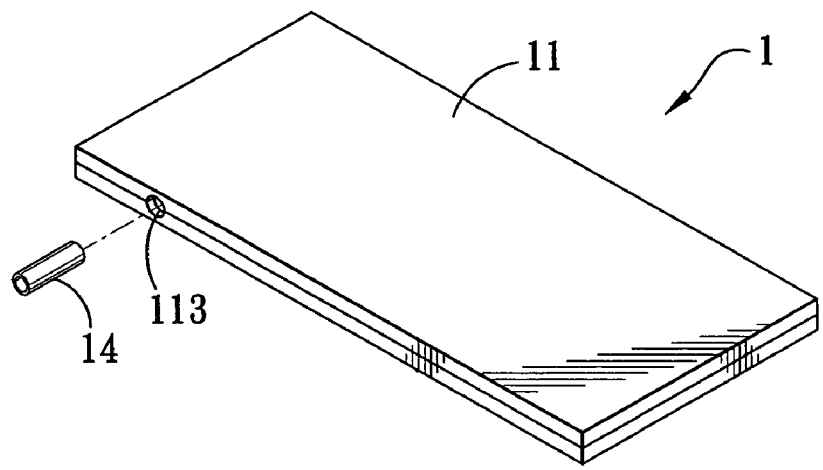
FIGS. 2 to 4 illustrate consecutive steps of a conventional method for making the heat dissipating device of FIG. 1.
Figure 3:
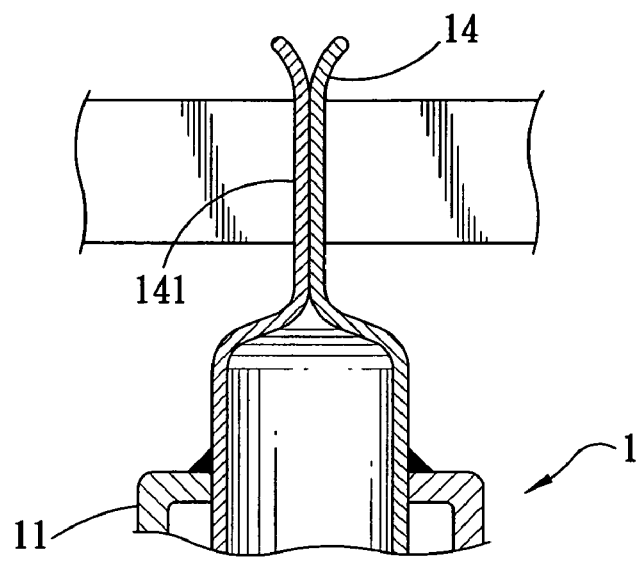
Figure 4:
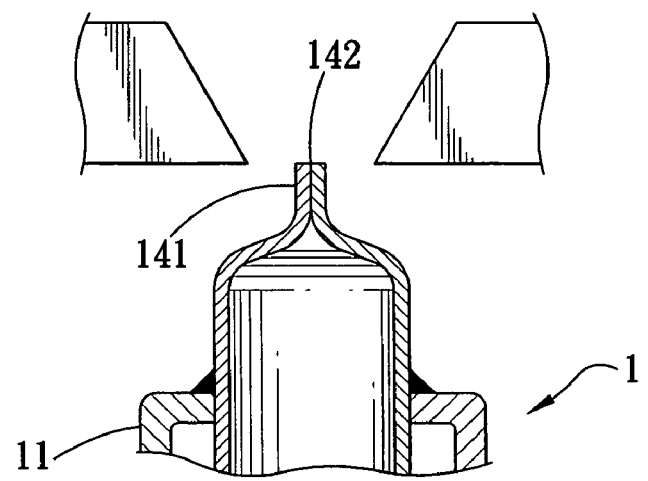

Before the present invention is described in greater detail, it should be noted that same reference numerals have been used to denote like elements throughout the specification.

Figure 5A:
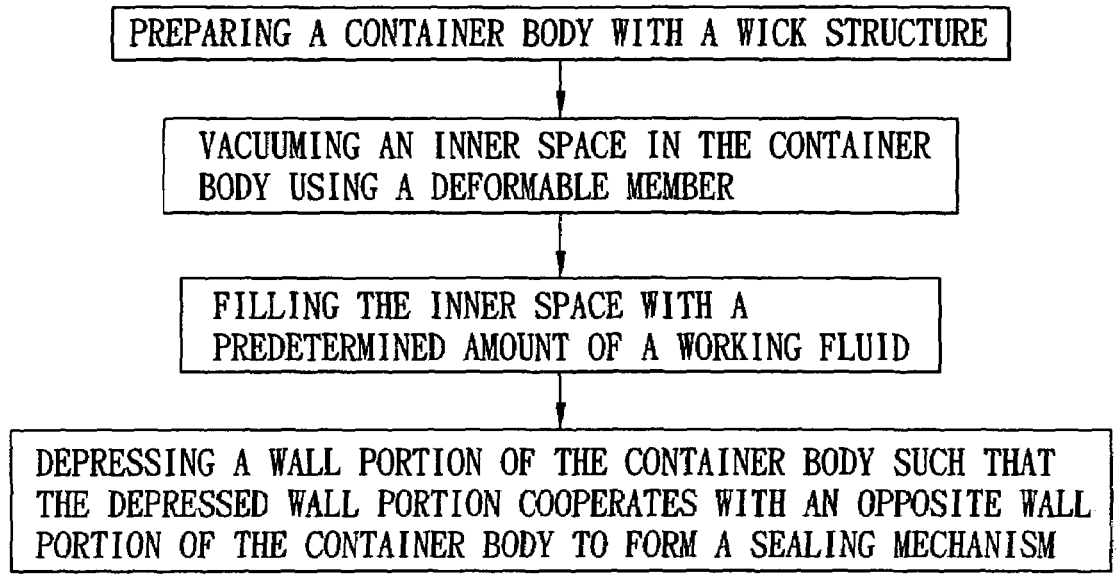
FIG. 5A is a flow chart illustrating consecutive steps of the first preferred embodiment of a method for making a heat dissipating device according to this invention.

FIG. 5A illustrates consecutive steps of the first preferred embodiment of a method for making a flat plate-type heat dissipating device according to the present invention. The heat dissipating device is useful for dissipating heat resulting from operation of electronic components, such as a CPU.

Figure 5B:
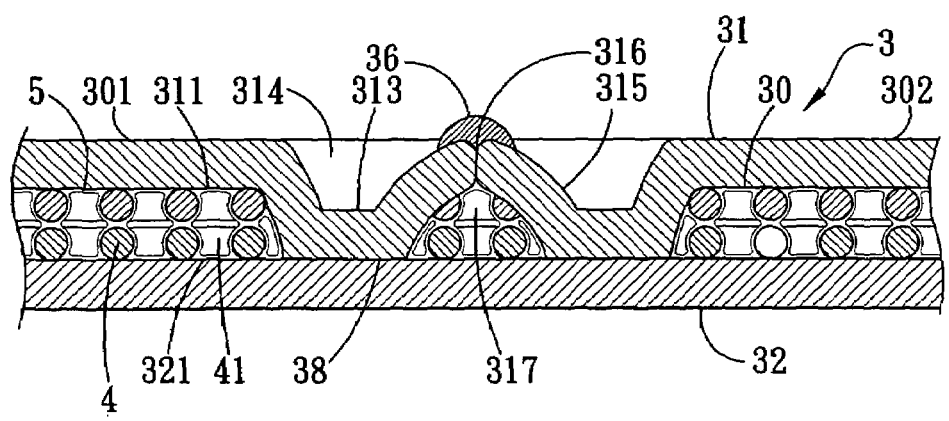
FIG. 5B is a fragmentary sectional view of a heat dissipating device formed according to the first preferred embodiment of the method of this invention.
Figure 6:
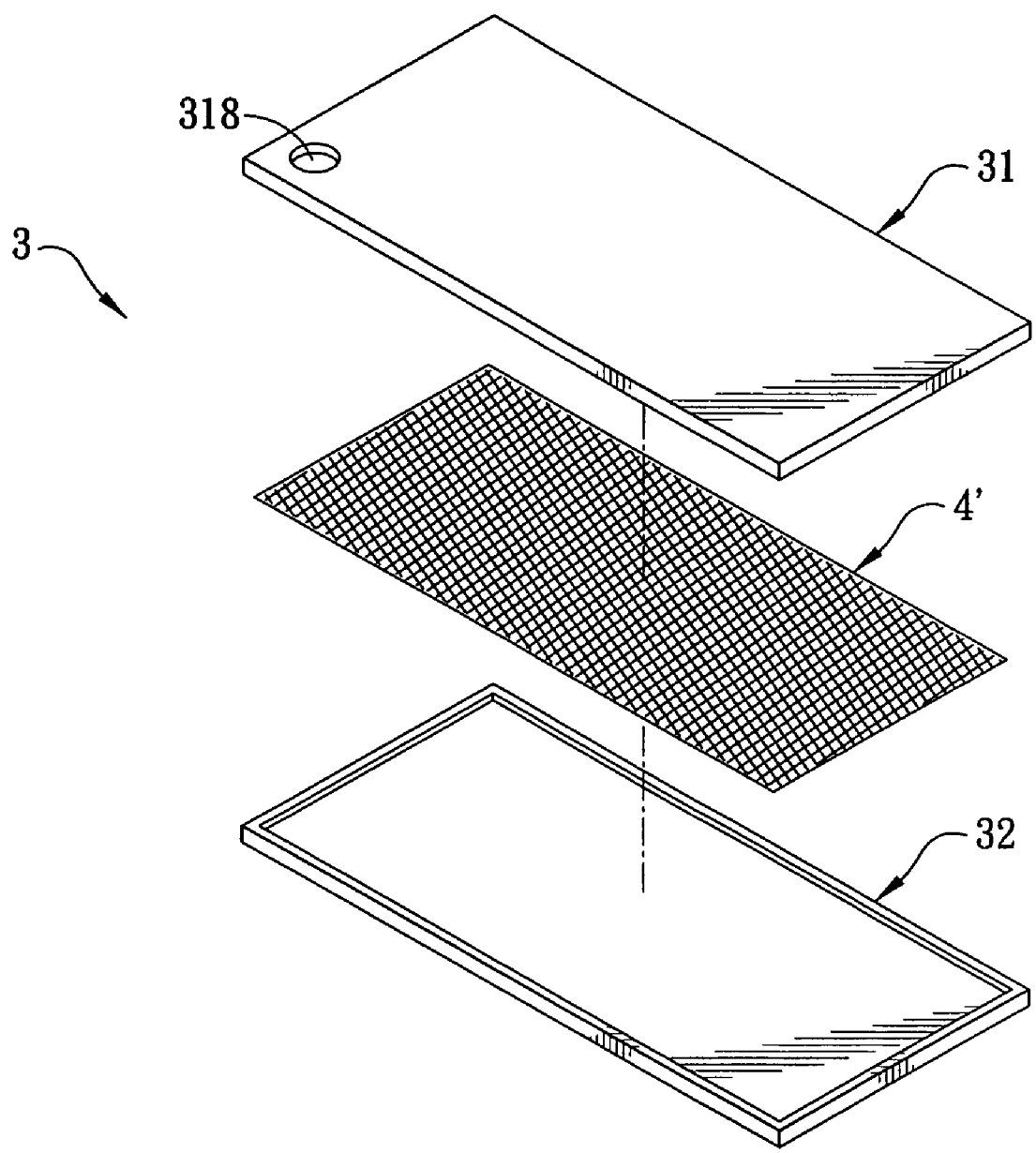
FIG. 6 is an exploded perspective view to illustrate how a wick structure is mounted in a container body according to the method of the first preferred embodiment.
Figure 7:
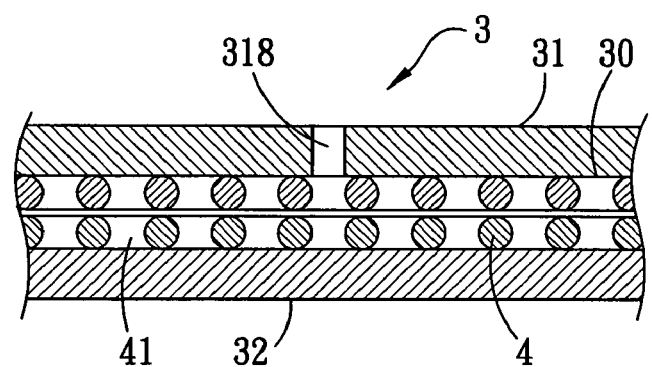
FIG. 7 is a fragmentary sectional view to illustrate the configuration of the wick structure of the heat dissipating device of this invention.
Figure 8:
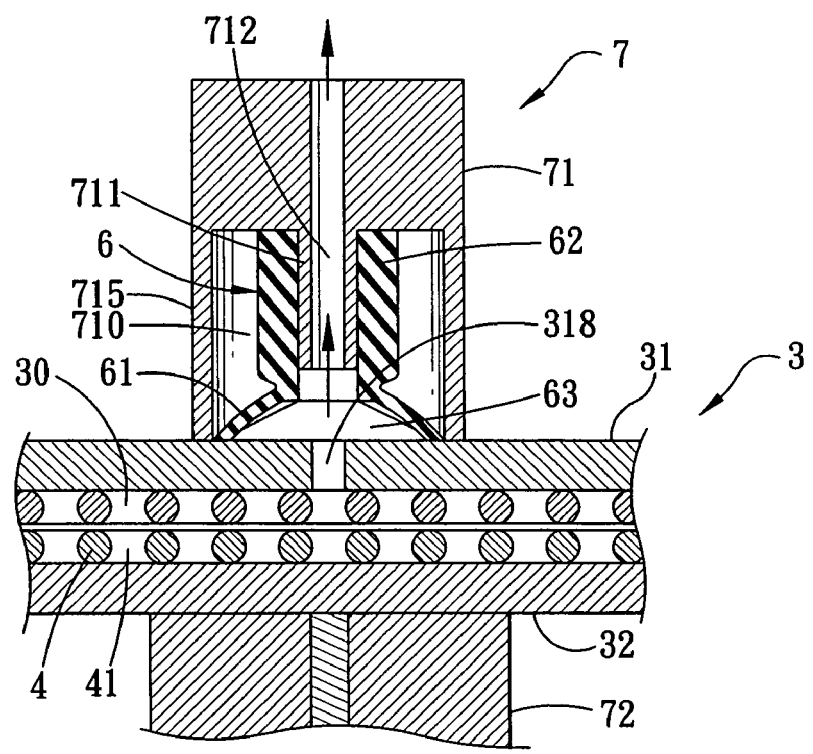
FIG. 8 is a fragmentary sectional view to illustrate how the container body is to connected to a vacuum-connecting member according to the method of the first preferred embodiment.

FIG. 5B illustrates the heat dissipating device formed according to the first preferred embodiment of this invention. The heat dissipating device thus formed includes: a container body 3 defining an inner space 30 therein, and having opposite heating and cooling ends 301, 302, a fluid passage 316 disposed between the heating and cooling ends 301, 302, and opposite flat upper and lower walls 31, 32 extending from the heating end 301 to the cooling end 302, each of the upper and lower walls 31, 32 having an inner surface 311, 321; a working fluid 5 received in the inner space 30 in the container body 3; a wick structure 4 mounted in the inner space 30 in the container body 3 and extending from the heating end 301 to the cooling end 302 to permit liquid flow from the cooling end 301 to the heating end 302 of the container body 3 by virtue of capillary mechanism when a vapor flow resulting from heating of the working fluid 5 at the heating end 301 flows to the cooling end 302 of the container body 3; and a sealing material 36 that seals the fluid passage 316. One of the upper and lower walls 31, 32, i.e., the upper wall 31, has a wall portion 313 that is disposed adjacent to the fluid passage 316 and that is depressed to form a first depression 314 indented inwardly of the inner space 30 in such a manner that the depressed wall portion 313 of said one of the upper and lower walls 31, 32 cooperates with the other of the upper and lower walls 31, 32 to form a sealing mechanism 38 that functions to isolate the fluid passage 316 from the inner space 30.

In this embodiment, the upper wall 31 is further formed with a bulging wall portion 315 that is surrounded by the depressed wall portion 313 and that protrudes into the first depression 314. The fluid passage 316 is formed in the bulging wall portion 315, and is deformed into a slit, which is sealed by the sealing material 36, after the depression operation of the upper wall 31. The bulging wall portion 315 of the upper wall 31 cooperates with the lower wall 32 to define a cavity 317 therebetween. The first depression 314 is looped in shape, and is preferably annular in shape. Each of the upper and lower walls 31, 32 is in the form of a flat plate.

The container body 3 is preferably made from a metal selected from the group consisting of copper and aluminum.

FIGS. 6 to 10, in combination with FIG. 5B, illustrate the consecutive steps of the first preferred embodiment of the method of this invention.

The method includes the steps of: preparing the container body 3 by assembling the upper and lower walls 31, 32 together (see FIGS. 6 and 7), and mounting a screen member 4' in the container body 3 to form the wick structure 4 that is connected to the upper and lower walls 31, 32 and that has a network of capillaries 41, the upper wall 31 being formed with the opening 318 that defines the fluid passage 316 and that is in fluid communication with the inner space 30; preparing a vacuum-connecting unit that includes an elastically deformable member 6 (see FIG. 8); mounting the elastically deformable member 6 on the container body 3 (see FIG. 8) in such a manner that the elastically deformable member 6 covers a periphery of the opening 318 and that the elastically deformable member 6 cooperates with the container body 3 to define a funnel cavity 63 in fluid communication with the inner space 30 through the opening 318; vacuuming the inner space 30 in the container body 3 (see FIG. 8) using a vacuuming device (not shown) in such a manner that air in the inner space 30 is drawn through the opening 318 and the funnel cavity 63 to the outside of the container body 3 and that the elastically deformable member 6 is elastically contracted due to vacuuming of the funnel cavity 63, thereby forming a sealing effect at a juncture between the elastically deformable member 6 and the periphery of the opening 318; filling the inner space 30 in the container body 3 with a predetermined amount of the working fluid 5 through the opening 318 (see FIG. 9); and forming a sealing mechanism 38 (see FIG. 10) that functions to isolate the inner space 30 from the opening 318.

In this embodiment, the elastically deformable member 6 has a funnel-shaped part 61 that is attached to the container body 3 to form the cavity 63, and a hollow connecting part 62 that extends from the funnel-shaped part 61 and that is adapted to be connected to the vacuuming device. Preferably, the elastically deformable member 6 is made from silicon or nitrile-butadiene rubber (NBR).

Figure 10:
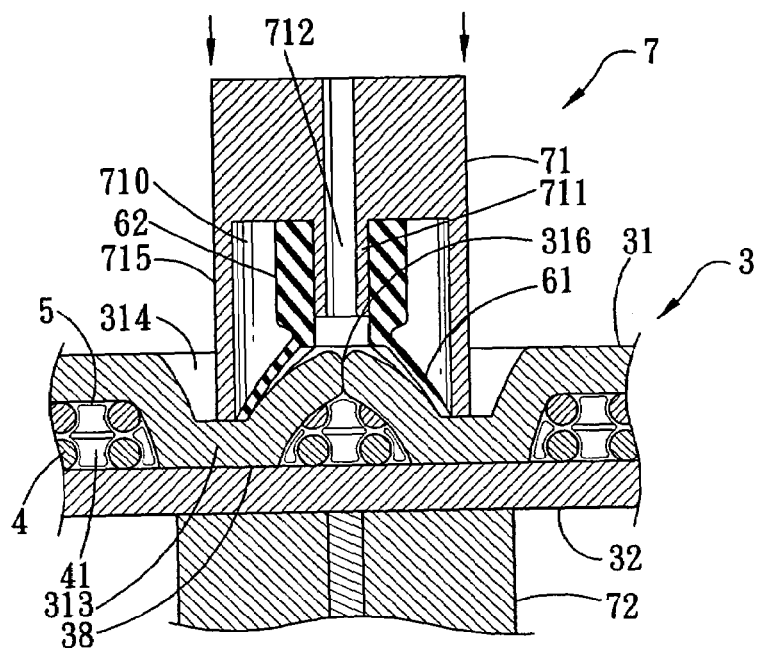
FIG. 10 is a fragmentary sectional view to illustrate how a depression is formed in an upper wall of the container body using a pressing device according to the method of the first preferred embodiment.

As best shown in FIG. 10, formation of the sealing mechanism 38 is conducted by pressing a portion 313 of the upper wall 31 of the container body 3 toward the lower wall 32 of the container body 3 in such a manner that the depressed portion 313 of the upper wall 31 is in sealing contact with the lower wall 32 and that the opening 318 efining the fluid passage 316 is deformed into the slit.

Figure 9:
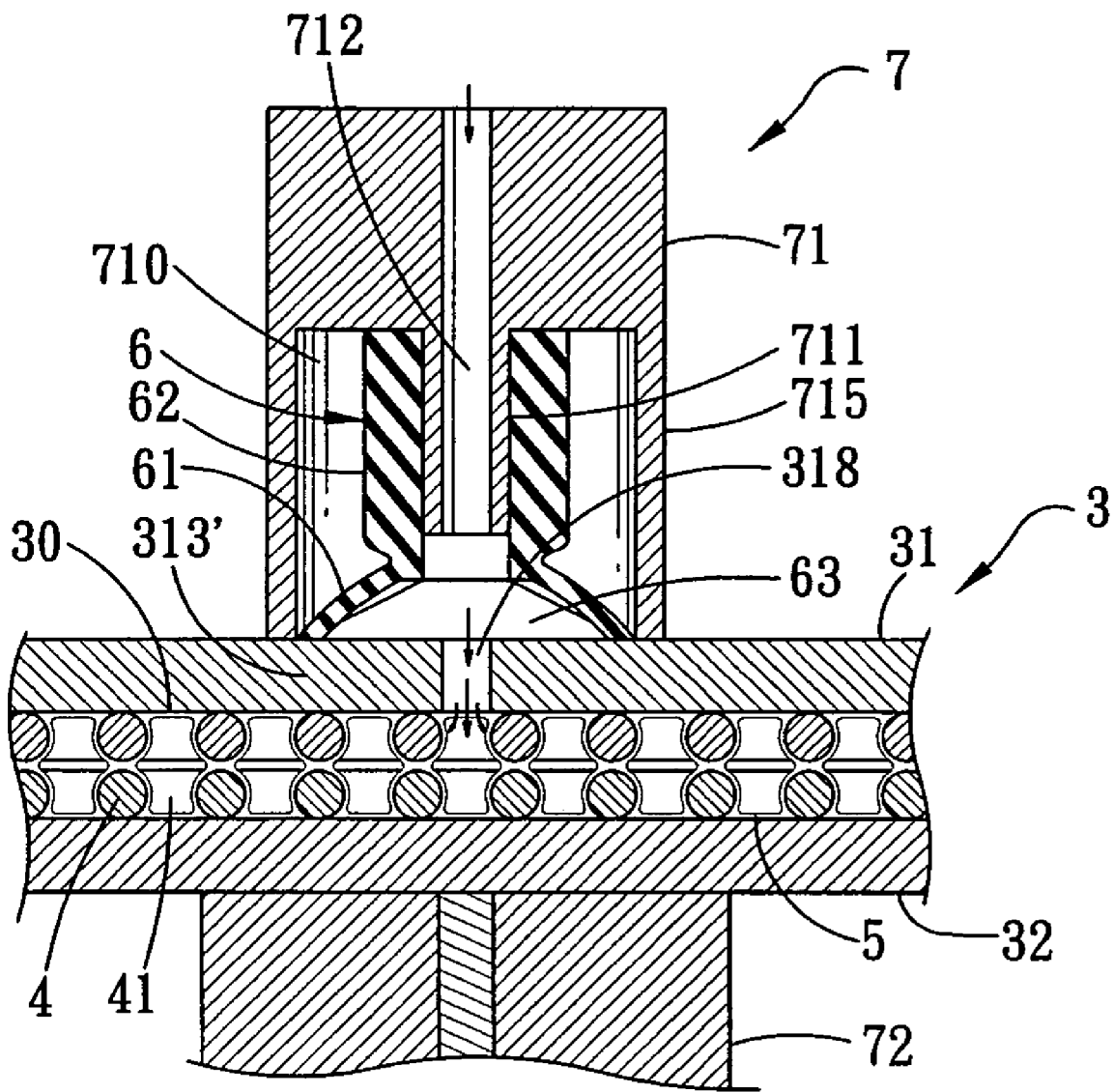
FIG. 9 is a fragmentary sectional view to illustrate how the container body is filled with a working fluid via the vacuum-connecting member according to the method of the first preferred embodiment.

The pressing of the upper wall 31 of the container body 3 is conducted by a depressing device 7 (see FIGS. 9 and 10). The depressing device 7 includes opposite upper and lower pressing members 71, 72. The lower pressing member 72 is disposed to abut against the lower wall 32 of the container body 3. The upper pressing member 71 has an annular outer part 715 that is disposed to abut against the upper wall 31 of the container body 3 and that defines an accommodating space 710 therein, and an inner tube 711 that is surrounded by the annular outer part 715 and that defines a fluid path 712 therein for fluid communication with the funnel cavity 63. The elastically deformable member 6 is mounted in the accommodating space 710 in such a manner that the connecting part 62 is securely sleeved on the inner tube 711 and that the funnel-shaped part 61 diverges downwardly from a lower end of the inner tube 711 to cover the periphery of the opening 318 in the upper wall 31 of the container body 3 when the upper pressing member 71 is disposed on the container body 3.

After formation of the sealing mechanism 38 and removal of the upper pressing member 71 together with the elastically deformable member 6 from the container body 3, the opening 318, which is now deformed into the slit, is sealed with the sealing material 36.

Figure 11:
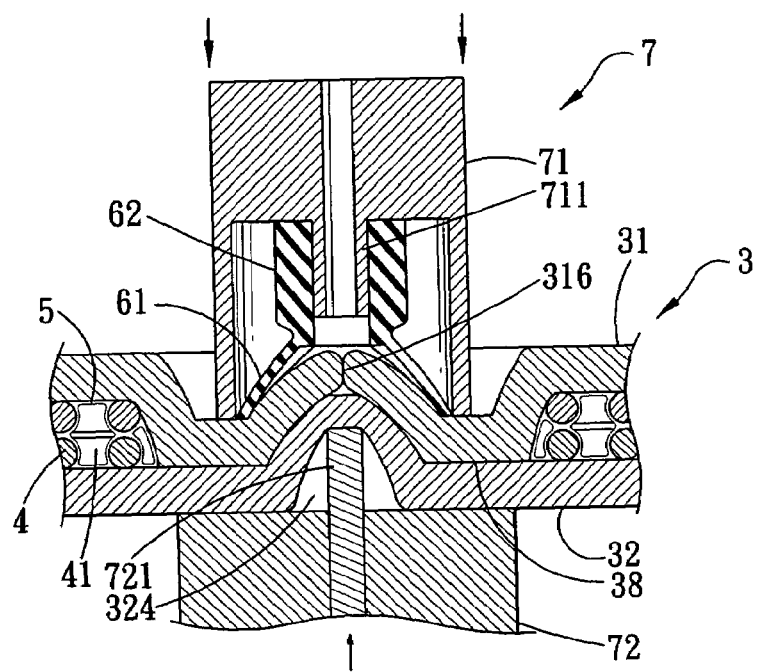
FIG. 11 is a fragmentary sectional view to illustrate how first and second depressions are respectively formed in the upper and lower walls of the container body using the pressing device according to the second preferred embodiment of the method of this invention.

FIG. 11 illustrates the second preferred embodiment of the method for making the heat dissipating device of this invention. The method of this embodiment differs from the previous embodiment in that the lower wall 32 is also depressed by a plunger 721 of the lower pressing member 72 so as to form a second depression 324 in the lower wall 32.

Figure 12:
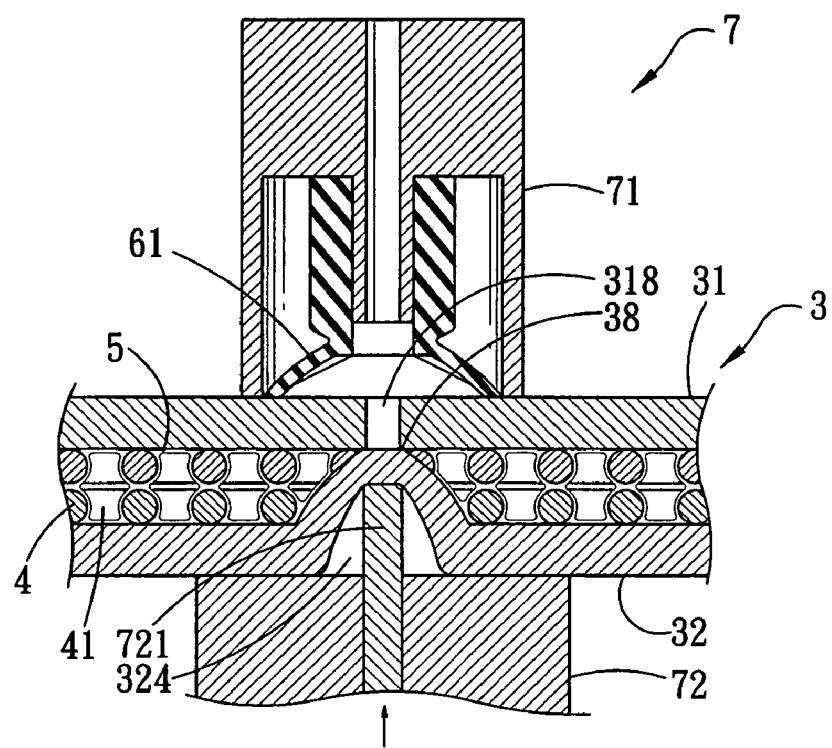
FIG. 12 is a fragmentary sectional view to illustrate how a depression is formed in the lower wall of the container body using the pressing device according to the third preferred embodiment of the method of this invention.

FIG. 12 illustrates the third preferred embodiment of the method for making the heat dissipating device. The method of this embodiment differs from the first preferred embodiment in that the lower wall 32 is depressed by the plunger 721 of the lower pressing member 72 while the upper pressing member 71 remains stationary so as to form the first depression 324 in the lower wall 32.

Figure 13:
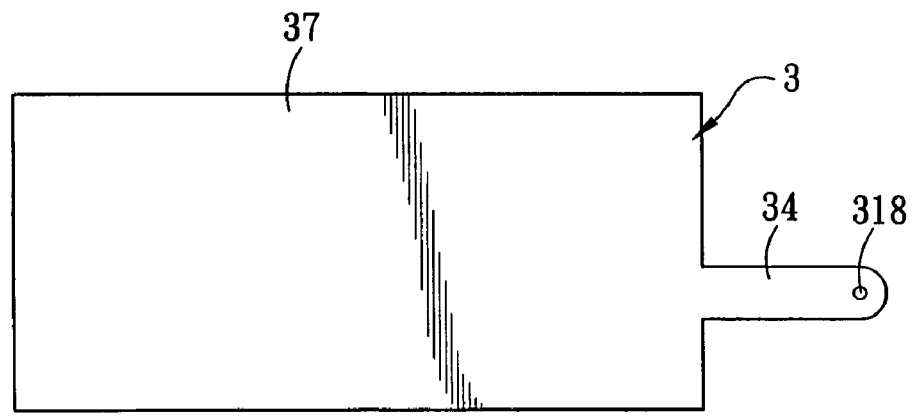
FIG. 13 is a schematic view to illustrate the configuration of a container body employed for the preparation of a heat dissipating device according to the fourth preferred embodiment of the method of this invention.
Figure 14:
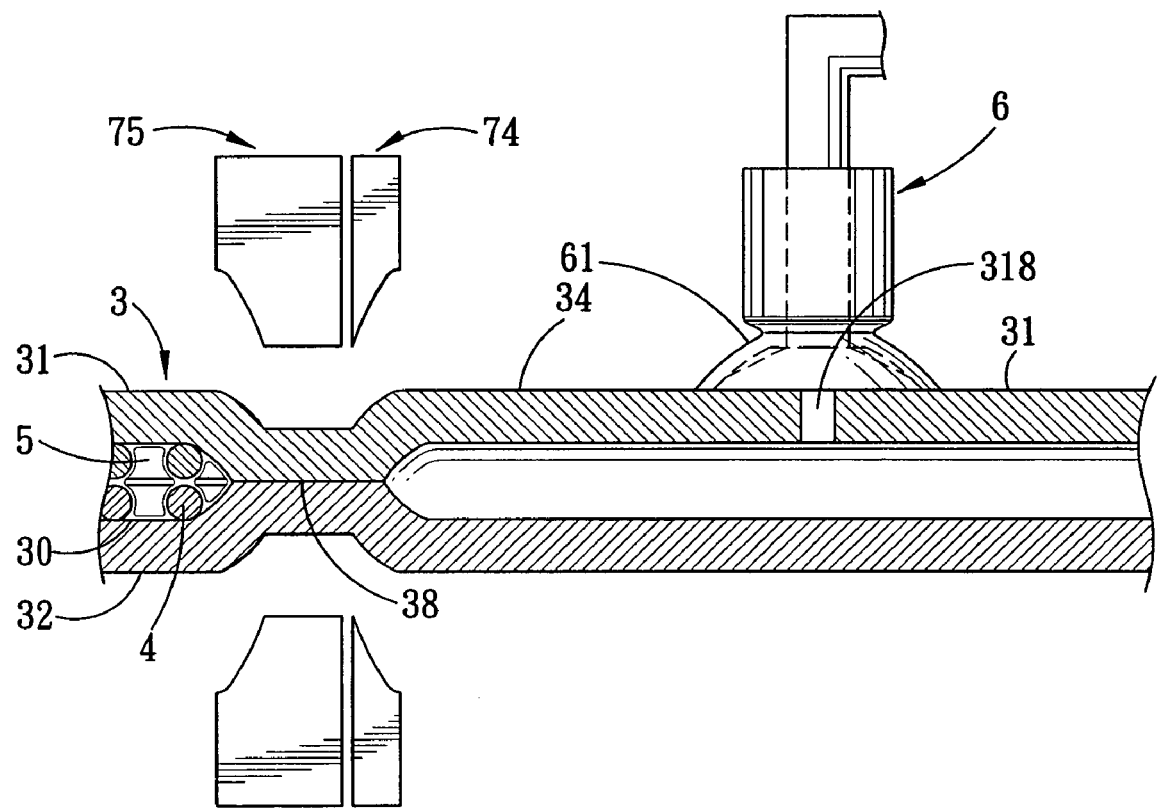
FIG. 14 is a fragmentary sectional view to illustrate how the heat dissipating device is formed according to the fourth preferred embodiment of this invention.

FIGS. 13 and 14 illustrate the fourth preferred embodiment of the method for making the heat dissipating device of this invention.

The container body 3 of the heat dissipating device of this embodiment has a main part 37 and an extension 34 reduced in cross-section from the main part 37. The upper and lower walls 31, 32 of the container body 3 extend from the main part 37 to the extension 34. The wick structure 4 extends within the main part 37. The upper wall 31 is formed with the opening 318 at the extension 34. The elastically deformable member 6 is mounted on the upper wall 31 to cover the opening 318, and is connected to the vacuuming device (not shown) for vacuuming the inner space 30. After filling the working fluid into the inner space 30, the upper and lower walls 31, 32 are depressed to form the sealing mechanism 38 to isolate the inner space 30 from the opening 318 using a pressing device 75, followed by cutting the extension 34 using a cutter 74 in such a manner that the depressed wall portion of the extension 34 remains on the main part 37.

By using the elastically deformable member 6 to connect the vacuuming device with the container body 3 for drawing air from the inner space 30 in the container body 3 according to the method of this invention, the aforesaid drawbacks of the prior art can be eliminated.

While the present invention has been described in connection with what is considered the most practical and preferred embodiments, it is understood that this invention is not limited to the disclosed embodiments but is intended to cover various arrangements included within the spirit and scope of the broadest interpretations and equivalent arrangements.

We claim:

1. A method for making a heat dissipating device, comprising:

preparing a container body that defines an inner space therein and that is formed with an opening in fluid communication with the inner space, the container body being provided with a wick structure mounted in the inner space;

mounting an elastically deformable member on the container body in such a manner that the elastically deformable member covers a periphery of the opening and that the elastically deformable member cooperates with the container body to define a cavity in fluid communication with the inner space through the opening, wherein the elastically deformable member has a funnel-shaped part that is attached to the container body to form the cavity, and a hollow connecting part that extends from the funnel-shaped part and that is adapted to be connected to a vacuuming device;

vacuuming the inner space in such a manner that air in the inner space is drawn through the opening and the cavity to the outside of the container body and that the elastically deformable member is elastically contracted due to vacuuming of the cavity, thereby forming a sealing effect at a juncture between the elastically deformable member and the periphery of the opening;

filling the inner space with a predetermined amount of a working fluid through the opening and the cavity;

forming a sealing mechanism that functions to isolate the inner space from the opening;

wherein the formation of the sealing mechanism is conducted by pressing a portion of an upper wall of the container body twoard a lower wall of the container body in such a manner that the depressed portion of the upper wall is in sealing contact with the lower wall; and wherein the pressing of the upper wall of the container body is conducted by a depressing device, the depressing device including opposite upper and lower pressing members, the lower pressing member being disposed to abut against the lower wall of the container body, the upper pressing member having an annular outer part that is disposed to abut against the upper wall of the container body and that defines an accommodating space therein, and an inner tube that is surrounded by the annular outer part and that defines a fluid path therein for fluid communication with the cavity, the elastically deformable member being mounted in the accommodating space in such a manner that the connecting part is securely sleeved on the inner tube and that the funnel-shaped part diverges downwardly from a lower end of the inner tube to cover the periphery of the opening in the container body when the upper pressing member is disposed on the container body.

2. The method of claim 1, further comprising sealing the opening with a sealing material after forming the depressed portion and removal of the upper pressing member together with the elastically deformable member from the container body.

* * * * *